United States Patent [19]

Hickling

[11] Patent Number: 4,480,315
[45] Date of Patent: Oct. 30, 1984

[54] DYNAMICALLY CONTROLLABLE ADDRESSING IN AUTOMATIC TEST EQUIPMENT

[75] Inventor: Robert L. Hickling, Sunnyvale, Calif.
[73] Assignee: Fairchild Camera and Instrument Corporation, San Jose, Calif.
[21] Appl. No.: 408,404
[22] Filed: Aug. 16, 1982
[51] Int. Cl.³ .................................................. G06F 1/00
[52] U.S. Cl. ................................ 364/900; 324/73 AT
[58] Field of Search ................... 324/73 AT; 371/15; 364/900 MS File, 200 MS File

[56] References Cited

U.S. PATENT DOCUMENTS 3,784,910 1/1974 Sylvan .......................... 324/73 AT Primary Examiner—Raulfe B. Zache
Attorney, Agent, or Firm—Theodore S. Park; Robert C. Colwell

[57] ABSTRACT

In an automatic test system, a dynamically controllable addressing circuit coupled to an address bus and a data bus includes a first register 10 for storing a fixed address, a programmable address register 12 connected to store address information from the data bus when the fixed address in the first register corresponds to address information on the address bus, and a programmable data register 18 connected to store data from the data bus when the address information in the programmable address register 12 corresponds to the address information on the address bus. In the preferred embodiment the address bus and the first register are connected through an exclusive or gate 14 to control the operation of the programmable address register 12. A second exclusive or gate 16 is connected between the address bus and the programmable address register 12 to control the operation of the programmable data register 18.

8 Claims, 1 Drawing Figure

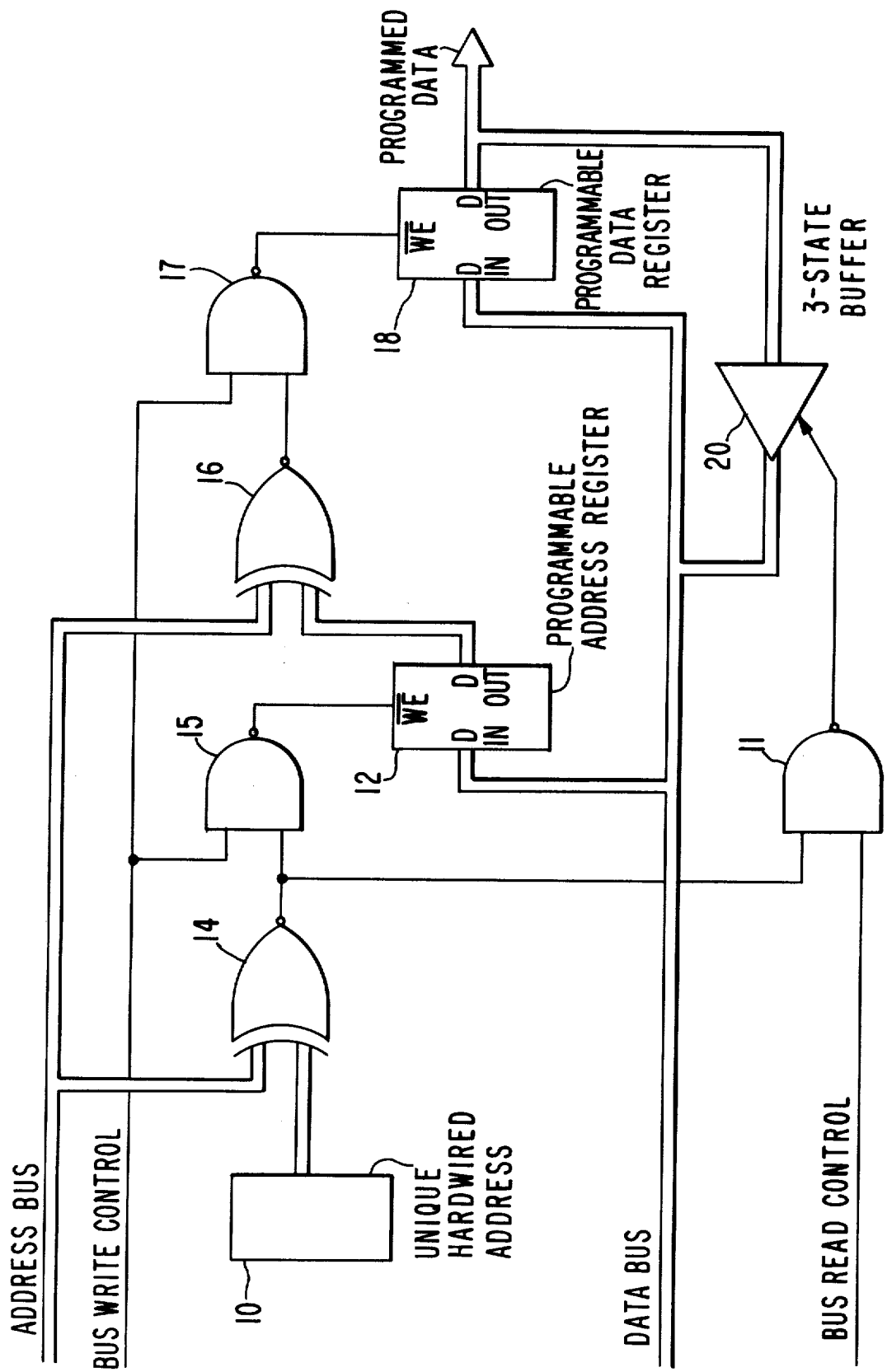

DYNAMICALLY CONTROLLABLE ADDRESSING IN AUTOMATIC TEST EQUIPMENT

BACKGROUND OF THE INVENTION

1. Field of the Invention

This invention relates to automatic test equipment for testing integrated circuits and other components, and, in particular, to a technique for allowing a computer to assign the hardware addresses of circuits being controlled by the computer. The invention is of primary importance in the field of automatic test equipment in which numerous identical resources must be allocated, controlled, and frequently supplied with identical data.

2. Description of the Prior Art

In conventional automatic test equipment for the testing of integrated circuits or other components, it is frequently necessary for a central host computer which controls the entire test apparatus to communicate with numerous peripheral units. Such peripheral units include pin electronic circuits, timing generators, digital to analog converters, and other units. In the prior art, the test system computer would communicate with each peripheral by, for example, looking up the address of the desired peripheral in a table, then specifying that address together with data or an instruction to be transmitted to the addressed peripheral. The process is then repeated for each subsequent unit, regardless of the number of units which are to be supplied with the same data or instruction. Such systems present a substantial disadvantage in the manufacture of automatic test equipment because the same information is frequently transmitted to groups of units.

SUMMARY OF THE INVENTION

This invention provides a method and apparatus by which the central test system computer may assign the hardware addresses of the various units it controls. By assigning the same address to all units which are to receive common data or instructions, the need to repetitively address successive units and supply the same data is eliminated. This allows overall faster operation of the test system, and therefore higher throughput of components being tested.

In the preferred embodiment, a dynamically controllable addressing circuit coupled to an address bus and a data bus comprises: a first register for storing a fixed address, a programmable address register connected to store address information from the data bus when the fixed address in the first register corresponds to address information on the address bus, and a programmable data register connected to store data information from the data bus when the address information in the programmable address register corresponds to the address information on the address bus.

BRIEF DESCRIPTIONS OF THE DRAWINGS

The FIGURE is a block diagram illustrating the preferred embodiment of the invention.

DETAILED DESCRIPTION OF THE PREFERRED EMBODIMENT

A block diagram of the preferred embodiment of the invention is shown in the FIGURE. As shown, a data bus and an address bus are used, in conjunction with logic gates 14 and 16, to control registers 10, 12 and 18. In the preferred embodiment the address and data buses will originate at the test system computer in an automatic test system. The address and data buses will be commonly coupled to numerous circuits such as depicted in the FIGURE, and it is desired to store and retrieve information from each of these numerous circuits. Each such circuit will have a unique hardwired address which is stored in register 10. The address there will be different from the address in every other circuit, and enables the test system computer to communicate with only the single addressed circuit. The remainder of the structure shown in the FIGURE allows the test system computer to assign the same address to each one of a desired group of similar circuits, only one of which is shown in the FIGURE.

Assignment of the same address to different units enables the computer to supply data to each of the units having a common address simultaneously. In prior arts test systems, each unit, or peripheral, was assigned a unique hardwired identity or address. When the test system computer wished to communicate with that particular device, its address was specified, together with the data to be transmitted to it. Because typically the test system computer communicated with many such devices or units, tables of addresses were necessary. Thus, if more than one device or unit was to receive common information from the test system computer, the address of the first such unit was retrieved and the data transmitted. Then, the address of the second unit would be retrieved and the same data transmitted, etc. The structure shown in the FIGURE eliminates this disadvantage of prior arts systems by allowing the test systems computer to commonly address all units which are to receive the same data. This is achieved in the following manner.

During a set-up phase of the operation of the test system, the unique hardwired address for each unit, such as the one depicted in the FIGURE, which is to receive the same data is determined. With the bus write control line enabled, the address of the first such unit is transmitted on the address bus, and a new address which will be common to all units which are to receive the same data will be supplied on the data bus. Logic gate 14 thus receives the address supplied from register 10 and the address on the address bus and enables, through gate 15, the programmable address register 12 to receive data from the data bus. This data, which is the new common address for all units which are to receive the same instructions or data, is then stored in register 12. This operation is repeated for each unit in the group of units to receive common data.

After the programmable address registers 12 of each such unit are appropriately loaded, this new common address is supplied on the address bus, and the desired data for all of the commonly addressed units is supplied on the data bus. Logic gate 16, in response to the matching of the address on the address bus with the address stored in the programmable address register 12, will enable the programmable data register 18, via gate 17, to receive data from the data bus. Because each unit which is to receive common data will have the same address in programmable address register 12, this common data will be stored in the programmable data register 18 of each such unit.

Well known techniques are used to read data from data register 18. The appropriate fixed address enables gate 14. The signal from gate 14, together with enabling of the bus read control line, will enable gate 11 and, in turn, enable 3-state buffer 20 to allow reading of data from register 18.

In addition to the advantages discussed above, this invention also allows improved resource allocation in automatic test systems. For example, if a test plan requires five units of a common resource, such as timing generators, and the first five consecutive units are not available, the first five available units may be assigned programmable addresses equivalent to the first five units, and the programmed test plan may then be run without modification. This eliminates the overhead associated with lookup tables for allocating resources.

Although a preferred embodiment of the invention has been described above, this description is intended to be illustrative of the invention. The scope of the invention may be determined from the appended claims.

I claim:

1. A dynamically controllable addressing circuit coupled to an address bus and a data bus, the circuit comprising:

first register means for storing a fixed address;
   programmable address register means connected to store address information from the data bus when the fixed address in the first register means corresponds to address information on the address bus; and
   programmable data register means connected to store data from the data bus when the address information in the programmable address register means corresponds to the address information on the address bus.

2. A circuit as in claim 1 wherein the first register means is coupled to a first terminal of a first logic gate and the address bus is coupled to a second terminal of the first logic gate.

3. A circuit as in claim 2 wherein an output signal from the first logic gate controls the programmable address register means.

4. A circuit as in claim 3 wherein the first logic gate comprises an exclusive or gate.

5. A circuit as in claim 1 wherein the address bus is also connected to a first terminal of a second logic gate.

6. A circuit as in claim 5 wherein a second terminal of the second logic gate is coupled to the programmable address register means.

7. A circuit as in claim 6 wherein an output terminal of the second logic gate is connected to the programmable data register means to control its operation.

8. A circuit as in claim 7 wherein the second logic gate means comprises an exclusive or gate.

* * * * *